United States Patent [19]

Pocholle et al.

[11] Patent Number: 5,369,524
[45] Date of Patent: Nov. 29, 1994

[54] OPTICAL FIBER MONOFREQUENCY POWER SOURCE

[75] Inventors: Jean-Paul Pocholle, Arpajon/La Norville; Michel Papuchon, Villebon Palaiseau; Claude Puech, Ballainvillers, all of France

[73] Assignee: Thomson-CSF, Puteaux, France

[21] Appl. No.: 946,592

[22] Filed: Sep. 18, 1992

[30] Foreign Application Priority Data

Sep. 24, 1991 [FR] France ................ 91 11742

[51] Int. Cl.⁵ ............ H01S 3/14; H01S 3/09
[52] U.S. Cl. .................. 359/345; 359/160; 359/341; 372/70
[58] Field of Search .......... 359/160, 174, 345, 341; 372/70–72

[56] References Cited

U.S. PATENT DOCUMENTS

| | | | |
|---|---|---|---|
| 4,644,555 | 2/1987 | Amano | 372/72 |
| 4,829,529 | 5/1989 | Kafka | 372/71 |
| 4,852,117 | 7/1989 | Po | 372/6 |
| 4,897,849 | 1/1990 | Hughes | 372/70 |
| 4,910,746 | 3/1990 | Nicholson | 372/72 |
| 5,185,814 | 2/1993 | Healey | 359/160 |

FOREIGN PATENT DOCUMENTS 0419059  3/1991  European Pat. Off. .
534820   3/1993  European Pat. Off. .
2681737  3/1993  France .

OTHER PUBLICATIONS

IEEE Photonics Technology Letters, vol. 2, No. 8, Aug. 1990, pp. 562–564, J. B. Schlager, et al., "Sub-picosecond Pulse Compression and Raman Generation Using a Mode-Locked Erbium-Doped Fiber Laser-Amplifier".
Optics Letters, vol. 14, No. 18, Sep. 15, 1989, pp. 999–1001, Y. Kimura, et al., "Laser-Diode Pumped Mirror-Free Er3+Doped Fiber Laser".
IEEE Photonics Technology Letters, vol. 2, No. 3, Mar. 1990, pp. 156–158, D. L. McDaniel, Jr., et al., "Vertical Cavity Surface-Emitting Semiconductor Laser With CW Injection Laser Pumping".
Mears et al.; Electronics Letters, vol. 23, No. 19, Sep. 10, 1987, pp. 1026–1028.
Farries et al.; Jour. of Lightwave Tech., vol. 7, #10, Oct. 1989, pp. 1473–1477.
Baker, R.; Physics World, Mar. 1990, pp. 41–44.

*Primary Examiner*—Nelson Moskowitz
*Attorney, Agent, or Firm*—Oblon, Spivak, McClelland, Maier & Neustadt

[57] ABSTRACT

A coherent light power source comprising an oscillator and an amplifying optical fiber, both optically excited by the same pumping source, the beam of wave length $L_S$ output by the oscillator being amplified in the optical fiber.

7 Claims, 1 Drawing Sheet

OPTICAL FIBER MONOFREQUENCY POWER SOURCE

BACKGROUND OF THE INVENTION

This invention applies to medium-power coherent light sources.

Telecommunications systems are now making increasingly wide use of optical fibers to transmit data and, among other devices, use amplifying optical fibers to increase the possible range between receivers.

DESCRIPTION OF THE PRIOR ART

These fibers are generally doped with rare earth materials to obtain a laser effect from the radiative changes in the excited ion energy levels of the rare earth materials. To obtain stimulated emission at wave length $L_S$, an external excitation, generally known as pumping, must be applied to cause population inversion between the ion fundamental level and the excited level of the earth material. This effect is generally produced by a laser diode whose emission is centered on the rare earth absorption band of the rare earth material. Consequently, a signal emitted at wave length $L_S$ can generate stimulated emission at the same wave length and thus cause signal amplification within the optical fiber. The combination of a signal emitter and amplifying optical fiber is a highly advantageous source of coherent light since it generates high power densities. In particular, this type of source can be used as the primary source in a more powerful laser.

SUMMARY OF THE INVENTION

This invention proposes a particularly simple and compact configuration of this type of medium-power coherent light source in which only one pumping source is used to excite the rare earth material in the optical fiber and provide the optical input to the signal source. Consequently, a medium-power coherent light source complying with the invention includes:

A pumping laser emitting at wave length $L_P$;

A coherent signal source emitting at wave length $L_S$;

An amplifying optical fiber doped with a rare earth material, this fiber receiving both the pumping light and the signal source light and emitting at wave length $L_S$, the coherent signal source and the rare earth material in the optical fiber being excited at the same wave length $L_p$ by the pumping laser.

The pumping laser preferably emits a beam applied to the signal source in a direction parallel to the beam emitted by the signal source. The pumping laser beam can be applied to the signal source in a direction opposite to that of the beam emitted by the source. Preferably, the signal source structure is such that only one frequency is emitted. It may be a surface-emission laser diode or a small laser strip comprising an active material and two mirrors to form a resonant cavity, the cavity being sufficiently thin to ensure that optical pumping generates only one emission frequency.

If the pumping laser medium is transparent to the signal source wave length, the beam from the source can pass through it, offering a particularly compact assembly in which the optical fiber and the signal source are placed on either side of the pumping laser, on the emission axis of the pumping laser.

BRIEF DESCRIPTION OF THE DRAWINGS

The invention will be better understood and other advantages will become clear upon reading the following description, which is not exhaustive, and studying the appended figures in which.

DETAILED DESCRIPTION OF THE PREFERRED EMBODIMENTS

Figure 1:
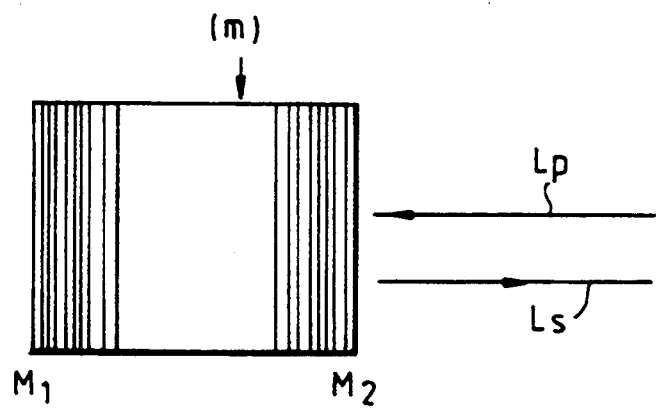
FIG. 1 represents an example a surface-emission laser diode type of signal source which can be used in a coherent light power source complying with the invention.

A coherent light power source complying with the invention comprises a single pumping laser $(L_P)$ emitting at a wave length $L_p$ and feeding light both to the coherent source (SC) of the signal wave length $L_S$ and the amplifying fiber (F). Preferably, the pumping laser $(L_P)$ is a laser diode, the type of semiconductive material depending on the pumping wave length $L_P$. For example, a laser diode produced by growing GaInAs/GaAlAs pseudomorphic compounds generates a pumping wave length of 0.98 μm whereas a GaInAsP laser diode generates a pumping wave length of 1.48 μm. The pumping laser emits a beam applied to the signal source (SC) in a direction parallel to the beam emitted by the signal source. The signal source consists of an active part, formed from a material capable of population inversion between the fundamental and excited states, a coherent radiation emitter and two mirrors placed on either side of the active material. The signal source (SC) can be a surface-emission laser diode produced by stacking layers of active materials and structures which act as Bragg-type mirrors. FIG. 1 shows this type of laser diode pumped by a laser, the pumping and signal emission light beams being parallel but in opposite directions. The active layer material (m) is selected to have a forbidden energy band selected to match the gain curve of the rare earth in the amplifying optical fiber. For example, if the fibers are doped with erbium $E_r^{3+}$, which will fluoresce in the 1.53–1.56 μm range, the material (m) in the surface emission laser diode can be of the GaInAsP type, the thickness of the active layer preferably being chosen to generate only one emission frequency thus forming a medium-power monofrequency coherent light source. A layer approx. 1 micron thick satisfies this requirement. The resonant cavity consists of two mirrors $M_1$ and $M_2$ on either side of the active material. These can be Bragg-type mirrors formed by stacking semiconductor materials transparent to the transmission and the pumping frequencies. It is also possible to use a Bragg mirror $M_1$ and a dielectric output mirror $M_2$. Output mirrors $M_2$ must be highly transparent to the pumping wave length $L_p$ so that the photons can excite material (m). The semiconductor materials are therefore chosen so that Bragg mirror $M_2$ is transparent to $L_P$.

Mirror $M_1$ is selected to reflect as much of the signal emitted at wave length $L_S$ as is possible in order to make the resonant cavity one-way; if this mirror also efficiently reflects the pumping wave length, the active material can be excited further by the back and forth motion of the photons. For example, if the pumping wave length $L_P = 0.98$ μm and the emitted signal wave length $L_S = 1.55$ μm:

The surface emission laser diode active material can be of the GaInAsP type;

Mirror $M_1$ can be a stack of InP/GaAs/GaAlAs materials;

Mirror $M_2$ can be a stack of GaInAsP/InP materials.

The total thickness of the mirrors is approx. 1 micron and they are produced by conventional methods of growing semiconductor compounds. It is also possible for the signal source (SC) to be a small laser plaque consisting of a solid material such as erbium glass doped with $E_r^{3+}$ ions or yttrium and aluminium garnet (YAG), again doped with $E_r^{3+}$ ions, mirrors $M_1$ and $M_2$ being directly the end faces of the active material. When such a signal source (SC) is used in compliance with the invention, the pumping beam is parallel to the beam emitted at wave length $L_S$ whereas, in general, the pumping beam is perpendicular to the axis of the resonating cavity.

The signal emitted at wave length $L_S$ and the pumping wave length $L_p$ are input to an amplifying fiber whose output is a preferably monofrequency medium-power coherent light source. To this end, the optics are designed to optimize coupling between the two light beams and the core of the fiber used. This fiber can be silicon-doped with a rare earth selected to match the wave length being used. For example, an erbium-doped silicon fiber can be used to obtain a coherent light power source at $L_S = 1.55$ μm. The $E_r^{3+}$ ion fluoresces in the range 1.53-1.56 μm when optically pumped by a pumping wave length $L_P = 0.808$ μm or $L_P = 0.98$ μm or, again, $L_P = 1.48$ μm. The active material used in the signal source (SC) is then selected so that it can be pumped by the same pumping wave length $L_p$ so that the signal is amplified in the optical fiber by stimulated emission. The material of mirrors $M_1$ and $M_2$ is also selected to match the chosen wave length $L_P$; for example, when the pumping wave length is 1.48 μm and the surface emission laser diode is based on the GaInAsP quarternary, the transparency of mirror $M_1$ to 1.48 μm can be achieved with Bragg mirrors consisting of a stack GaInAsP/InP materials.

Figure 2:
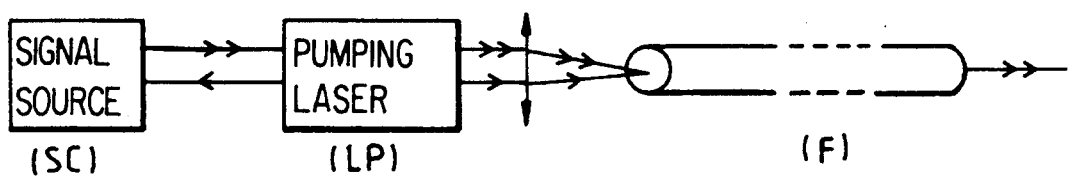
FIG. 2 illustrates a source complying with the invention in which the pumping laser is transparent to the signal wave, which passes through the laser.

If the active material in the pumping laser is transparent to wave length $L_S$, it then becomes possible to construct a coherent light source, complying with the invention, which is an in-line assembly and, therefore, particularly simple and compact. FIG. 2 shows such an example of a source in which the pumping laser simultaneously excites, by emitting on both faces, both the coherent signal source (SC) and the amplifying fiber doped with rare earth. Such a configuration requires no bevel mirror and makes the source particularly practical to handle.

The source complying with the invention can be tuned to the various emitting wave lengths of interest, since the fibers can be doped with other rare earth material ions such as Holmium; a silicon fiber doped with Holmium and codoped with $Tm^{3+}$ ions can emit at 2.04 μm when pumped at a wave length $L_p$ of approx. 0.8 μm. A surface-emitting laser diode in which the active material is AlGaAsSb-type compounds can feed a Holmium-doped optical fiber to provide a 2.04 μm coherent light power source.

Consequently, monofrequency coherent light power sources complying with the invention and operating at selected wave lengths can also be used as primary sources to control more powerful lasers.

What is claimed is:

1. A coherent light power source, comprising:
   a pumping laser for emitting first and second beams of light at a first wavelength;
   a coherent signal source for emitting a third beam of light at a second wavelength; and
   an amplifying optical fiber for receiving said first beam of light emitted by said pumping laser and said third beam of light emitted by said coherent signal source, wherein said second beam of light at said first wavelength is received by said coherent signal source and said third beam of light at said second wavelength is received by said amplifying optical fiber through said pumping laser which is transparent to said third beam of light.

2. The coherent light power source according to claim 1, wherein the pumping laser emits said third light beam to said coherent signal source in a direction parallel to said second light beam emitted by said coherent signal source.

3. The coherent light power source according to claim 2, wherein said coherent signal source receives said third light beam from a direction opposite to the direction of said second light beam.

4. The coherent light power source according to any one of claims 1-3, wherein said coherent signal source is a Raman frequency laser source.

5. The coherent light power source according to claim 4, wherein said coherent signal source is a surface emitting laser diode.

6. The coherent light power source according to any one of claims 1-3, wherein said pumping laser is located on the emission axis of said coherent signal source.

7. The coherent light power source according to claim 6, wherein said amplifying optical fiber and said coherent signal source are placed on either side of the pumping laser, on the emitting axis of the pumping laser.

* * * * *